United States Patent
Chu et al.

(10) Patent No.: US 11,676,862 B2
(45) Date of Patent: Jun. 13, 2023

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Hwei-Jay Chu, Hsinchu (TW); Chieh-Han Wu, Kaohsiung (TW); Hsin-Chieh Yao, Hsinchu (TW); Cheng-Hsiung Tsai, Miaoli (TW); Chung-Ju Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 113 days.

(21) Appl. No.: 17/187,343

(22) Filed: Feb. 26, 2021

(65) Prior Publication Data

US 2022/0277995 A1    Sep. 1, 2022

(51) Int. Cl.
*H01L 21/768* (2006.01)
*H01L 23/535* (2006.01)

(52) U.S. Cl.
CPC .. *H01L 21/76877* (2013.01); *H01L 21/76831* (2013.01); *H01L 21/76832* (2013.01); *H01L 23/535* (2013.01)

(58) Field of Classification Search
CPC ........... H01L 23/5226; H01L 23/53238; H01L 23/53295; H01L 21/31144; H01L 21/76807; H01L 21/76877; H01L 21/76831; H01L 21/76832; H01L 21/76816
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2014/0242792 A1* | 8/2014 | Liu | H01L 21/7682 438/624 |
| 2022/0285268 A1* | 9/2022 | Lee | H01L 21/76849 |
| 2022/0293462 A1* | 9/2022 | Lee | H01L 21/7682 |
| 2023/0011792 A1* | 1/2023 | Wu | H01L 21/76885 |

* cited by examiner

*Primary Examiner* — Jaehwan Oh
*Assistant Examiner* — John M Parker
(74) *Attorney, Agent, or Firm* — Nz Carr Law Office

(57) ABSTRACT

An interconnection structure, along with methods of forming such, are described. The structure includes a first conductive feature having a first thickness, a first dielectric material disposed adjacent the first conductive feature, and the first dielectric material has a second thickness greater than the first thickness. The structure further includes a second conductive feature disposed adjacent the first dielectric material, a first etch stop layer disposed on the first conductive feature, a second etch stop layer disposed on the first dielectric material, and a second dielectric material disposed on the first etch stop layer and the second etch stop layer. The second dielectric material is in contact with the first dielectric material.

20 Claims, 14 Drawing Sheets

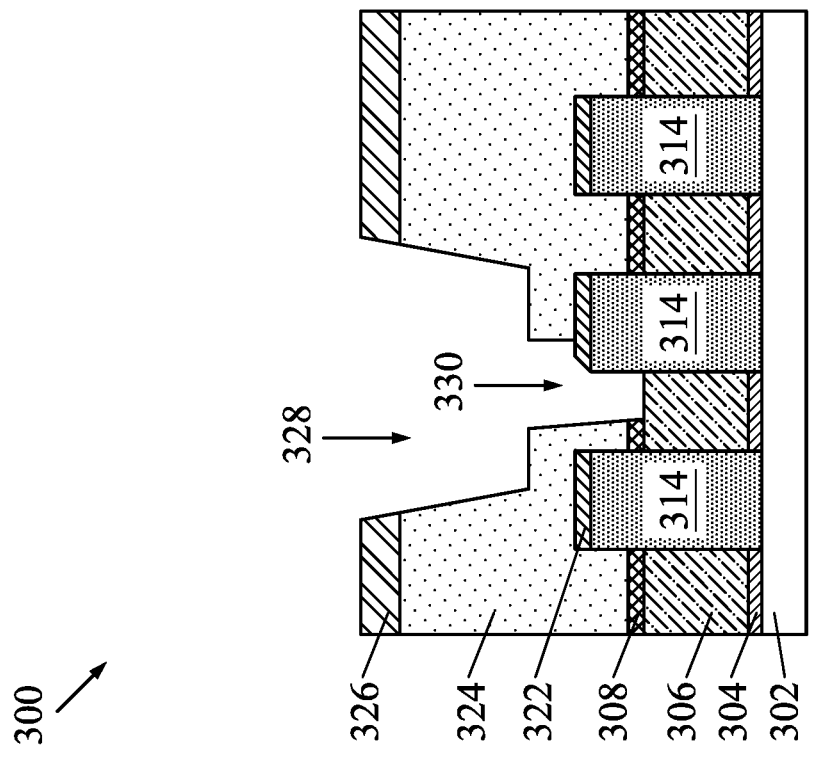
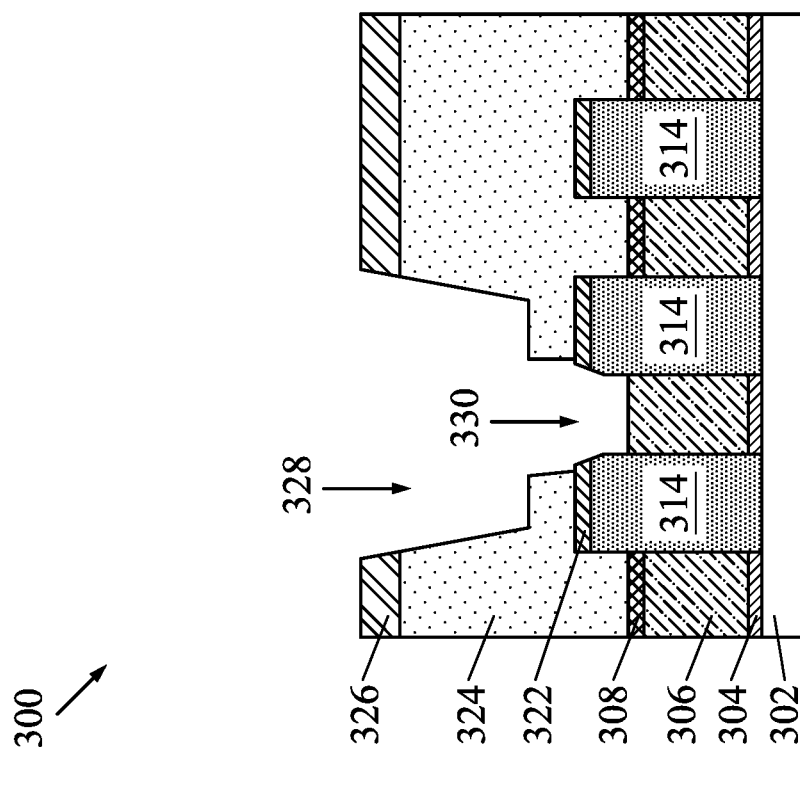

SEMICONDUCTOR DEVICE STRUCTURE AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. In the past, such reductions were limited only by the ability to define the structures photo-lithographically, device geometries having smaller dimensions created new limiting factors. With decreasing semiconductor device dimensions, improved semiconductor devices with reduced line to line leakage is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3L are cross-sectional side views of various stages of manufacturing the interconnection structure, in accordance with alternative embodiments.

DETAILED DESCRIPTION

Figure 1:
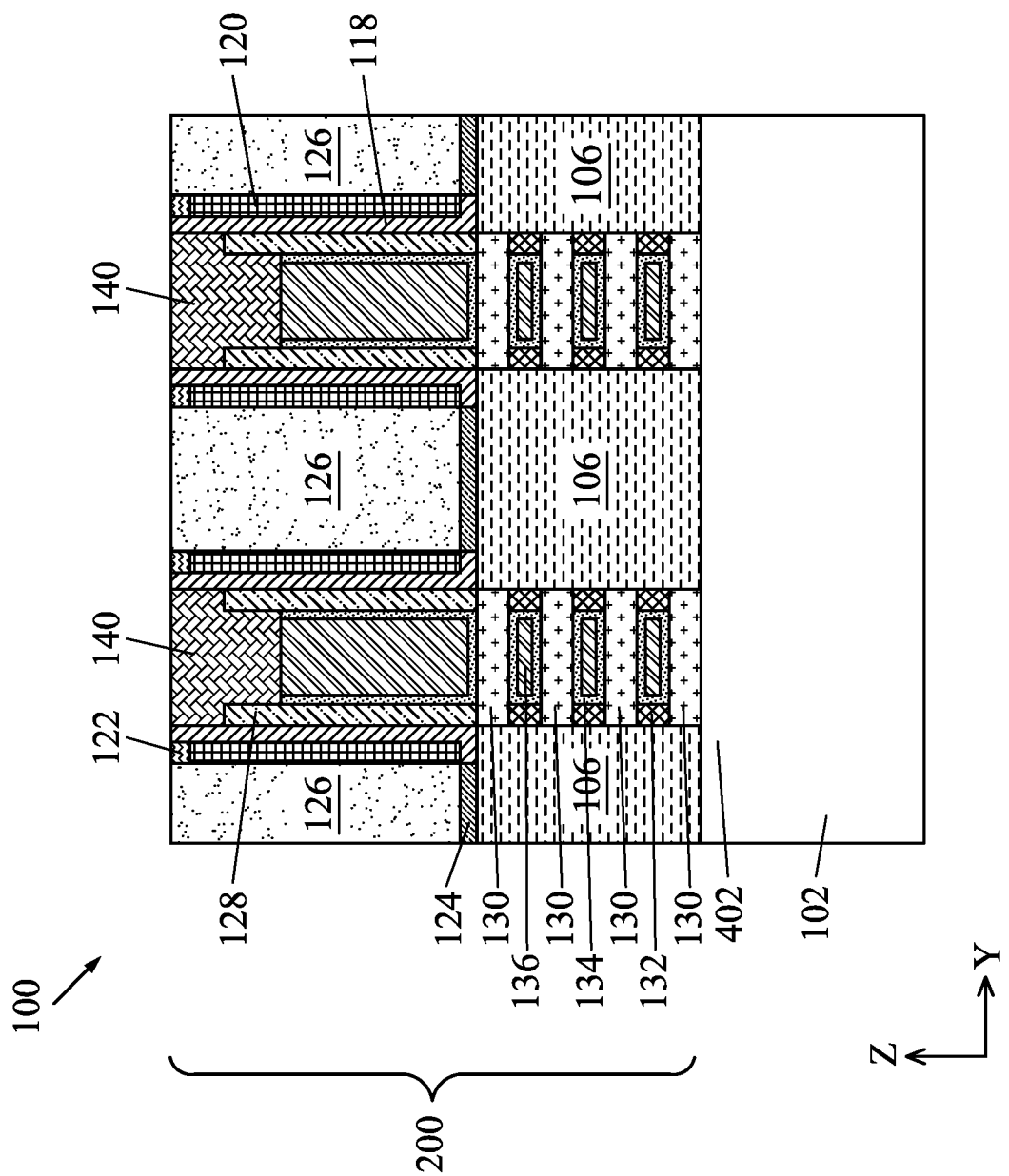
FIG. 1 is a cross-sectional side view of the stage of manufacturing the semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a stage of manufacturing a semiconductor device structure 100. As shown in FIG. 1, the semiconductor device structure 100 includes a substrate 102 having substrate portions 104 extending therefrom and source/drain (S/D) epitaxial features 106 disposed over the substrate portions 104. The substrate 102 may be a semiconductor substrate, such as a bulk silicon substrate. In some embodiments, the substrate 102 may be an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; other suitable materials; or combinations thereof. Possible substrates 102 also include a silicon-on-insulator (SOI) substrate. SOI substrates are fabricated using separation by implantation of oxygen (SIMOX), wafer bonding, and/or other suitable methods. The substrate portions 104 may be formed by recessing portions of the substrate 102. Thus, the substrate portions 104 may include the same material as the substrate 102. The substrate 102 and the substrate portions 104 may include various regions that have been suitably doped with impurities (e.g., p-type or n-type impurities). The dopants are, for example boron for a p-type field effect transistor (PFET) and phosphorus for an n-type field effect transistor (NFET). The S/D epitaxial features 106 may include a semiconductor material, such as Si or Ge, a III-V compound semiconductor, a II-VI compound semiconductor, or other suitable semiconductor material. Exemplary S/D epitaxial features 106 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D epitaxial features 106 may include p-type dopants, such as boron; n-type dopants, such as phosphorus or arsenic; and/or other suitable dopants including combinations thereof.

As shown in FIG. 1, S/D epitaxial features 106 may be connected by one or more semiconductor layers 130, which may be channels of a FET. In some embodiments, the FET is a nanostructure FET including a plurality of semiconductor layers 130, and at least a portion of each semiconductor layer 130 is wrapped around by a gate electrode layer 136. The semiconductor layer 130 may be or include materials such as Si, Ge, SiC, GeAs, GaP, InP, InAs, InSb, GaAsP, AlInAs, AlGaAs, InGaAs, GaInP, GaInAsP, or other suitable material. In some embodiments, each semiconductor layer 130 is made of Si. The gate electrode layer 136 includes one or more layers of electrically conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. In some embodiments, the gate electrode layer 136 includes a metal. A gate dielectric layer 134 may be disposed between the gate electrode layer 136 and the semiconductor layers 130. The gate dielectric layer 134 may include two or more layers, such as an interfacial layer and a high-k dielectric layer. In some embodiments, the interfacial layer is an oxide layer, and the high-k dielectric layer includes hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), hafnium dioxide-alumina (HfO$_2$—Al$_2$O$_3$) alloy, or other suitable high-k materials.

The gate dielectric layer 134 and the gate electrode layer 136 may be separated from the S/D epitaxial features 106 by inner spacers 132. The inner spacers 132 may include a dielectric material, such as SiON, SiCN, SiOC, SiOCN, or SiN. Spacers 128 may be disposed over the plurality of semiconductor layers 130. The spacers 128 may include a dielectric material such as silicon oxide, silicon nitride, silicon carbide, silicon oxynitride, SiCN, silicon oxycarbide, SiOCN, and/or combinations thereof. In some embodiments, a self-aligned contact (SAC) layer 140 is formed over the spacers 128, the gate dielectric layer 134, and the gate electrode layer 136, as shown in FIG. 1. The SAC layer 140 may include any suitable material such as SiO, SiN, SiC, SiON, SiOC, SiCN, SiOCN, AlO, AlON, ZrO, ZrN, or combinations thereof.

A contact etch stop layer (CESL) 118 and an interlayer dielectric (ILD) layer 120 are disposed over the S/D epitaxial features 106, as shown in FIG. 1. The CESL 118 may include an oxygen-containing material or a nitrogen-containing material, such as silicon nitride, silicon carbon nitride, silicon oxynitride, carbon nitride, silicon oxide, silicon carbon oxide, the like, or a combination thereof. The materials for the ILD layer 120 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A cap layer 122 may be disposed on the ILD layer 120, and the cap layer 122 may include a nitrogen-containing material, such as SiCN.

Conductive contacts 126 may be disposed in the ILD layer 120 and over the S/D epitaxial features 106, as shown in FIG. 1. The conductive contacts 126 may include one or more electrically conductive material, such as Ru, Mo, Co, Ni. W, Ti, Ta, Cu, Al, TiN and TaN. Silicide layers 124 may be disposed between the conductive contacts 126 and the S/D epitaxial features 106.

As shown in FIG. 1, the semiconductor device structure 100 may include the substrate 102 and a device layer 200 disposed over the substrate 102. The device layer 200 may include one or more devices, such as transistors, diodes, imaging sensors, resistors, capacitors, inductors, memory cells, combinations thereof, and/or other suitable devices. In some embodiments, the device layer 200 includes transistors, such as nanostructure transistors having a plurality of channels wrapped around by the gate electrode layer, as described above. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The channel(s) of the semiconductor device structure 100 may be surrounded by the gate electrode layer. The nanostructure transistors may be referred to as nanosheet transistors, nanowire transistors, gate-all-around (GAA) transistors, multi-bridge channel (MBC) transistors, or any transistors having the gate electrode layer surrounding the channels. In some embodiments, the device layer 200 includes planar FET, FinFET, complementary FET (CFET), forksheet FET, or other suitable devices.

Figure 2B:
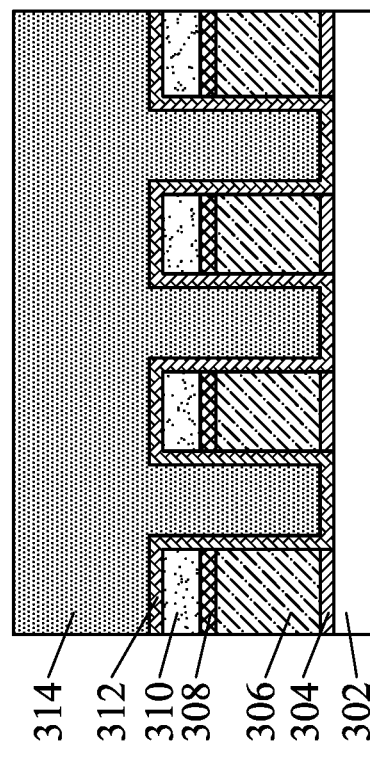
FIGS. 2A-2N are cross-sectional side views of various stages of manufacturing an interconnection structure, in accordance with some embodiments.
Figure 2A:
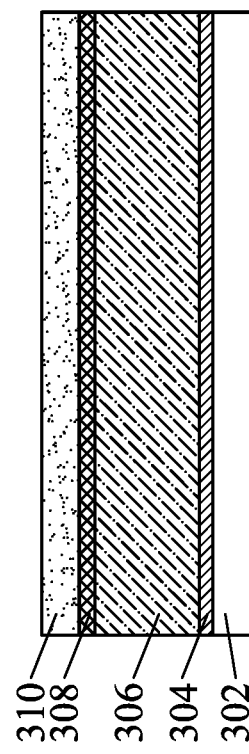
Figure 2D:
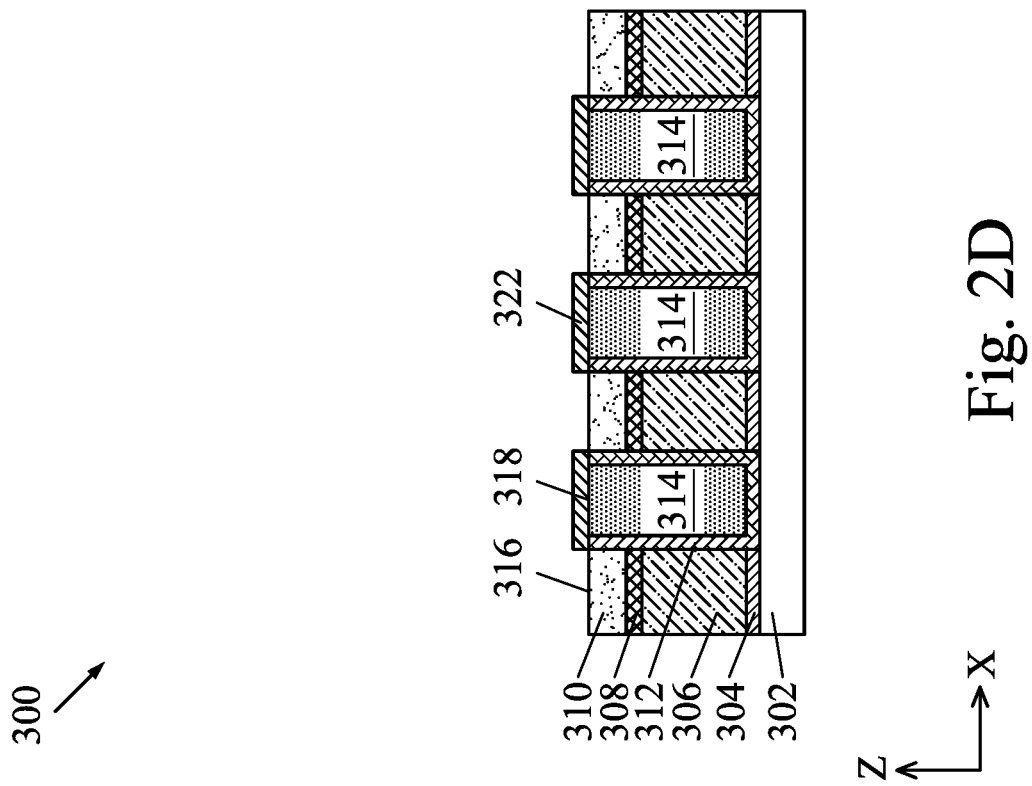
Figure 2C:
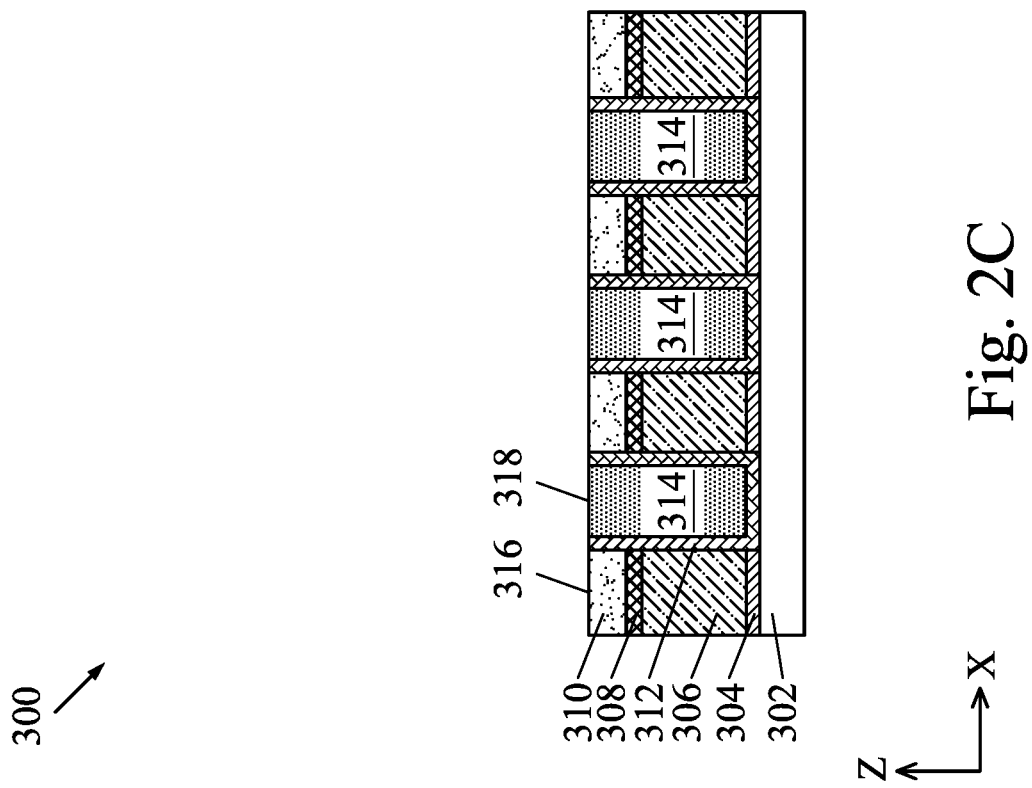
Figure 2F:
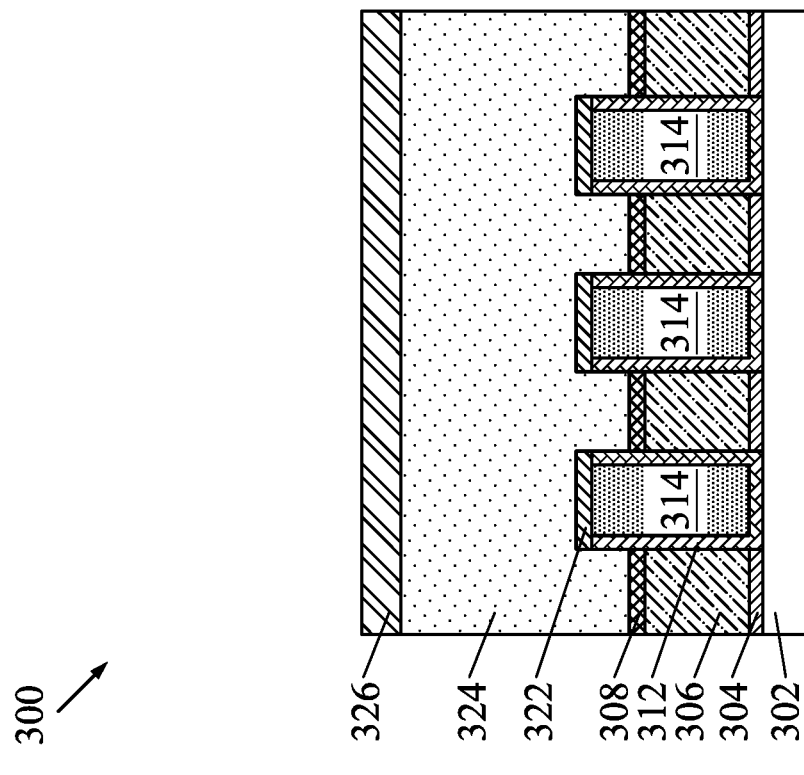
Figure 2E:
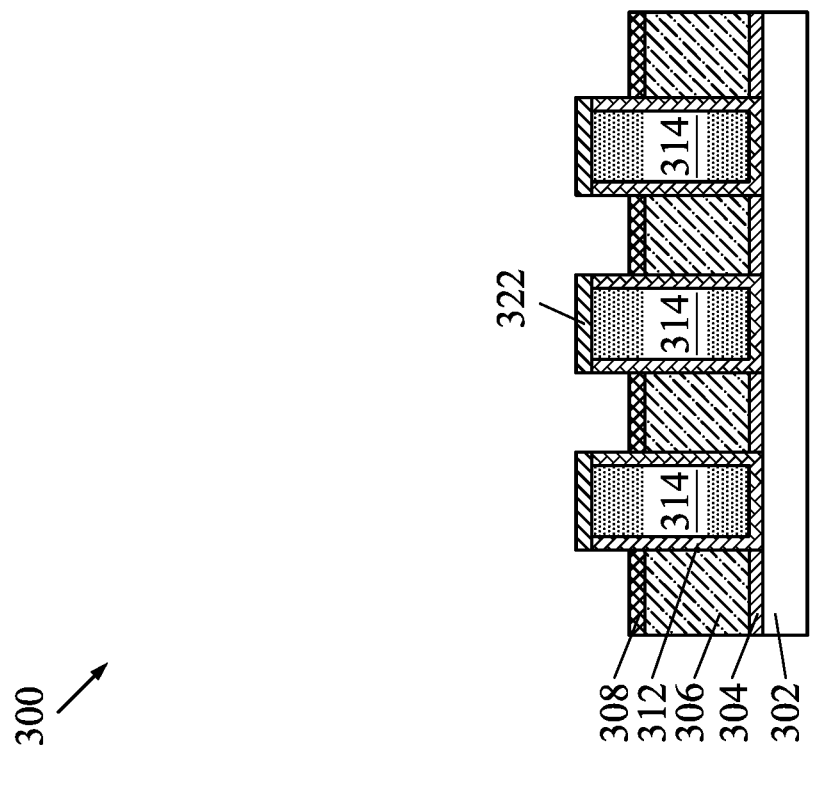
Figure 2H:
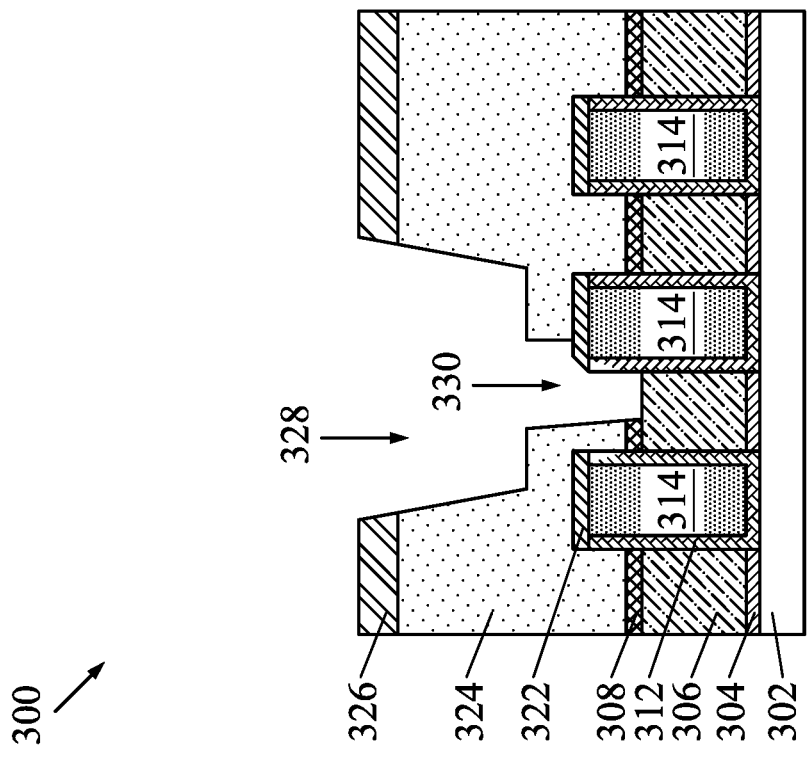
Figure 2G:
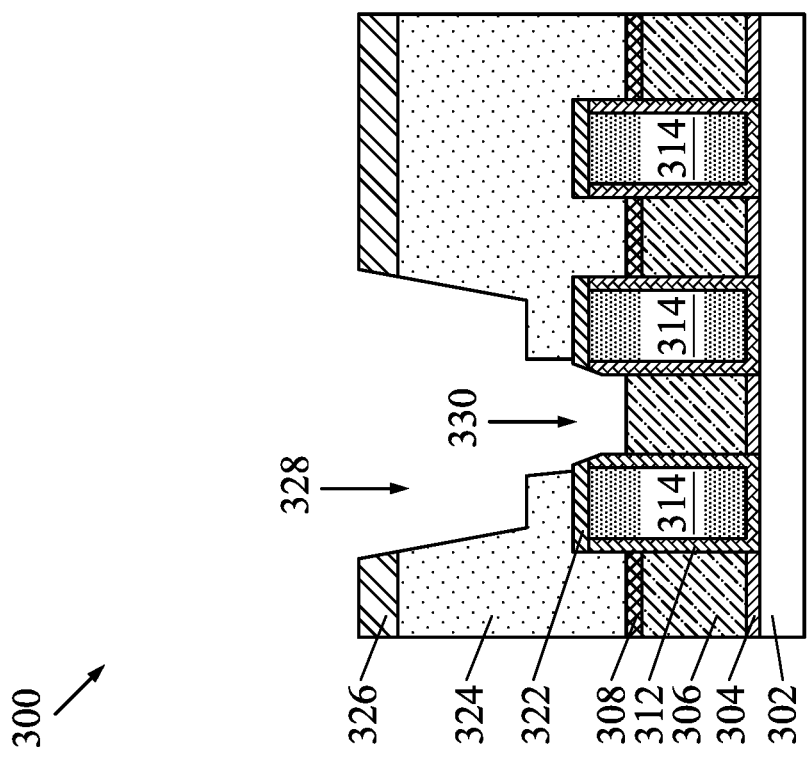
Figure 2J:
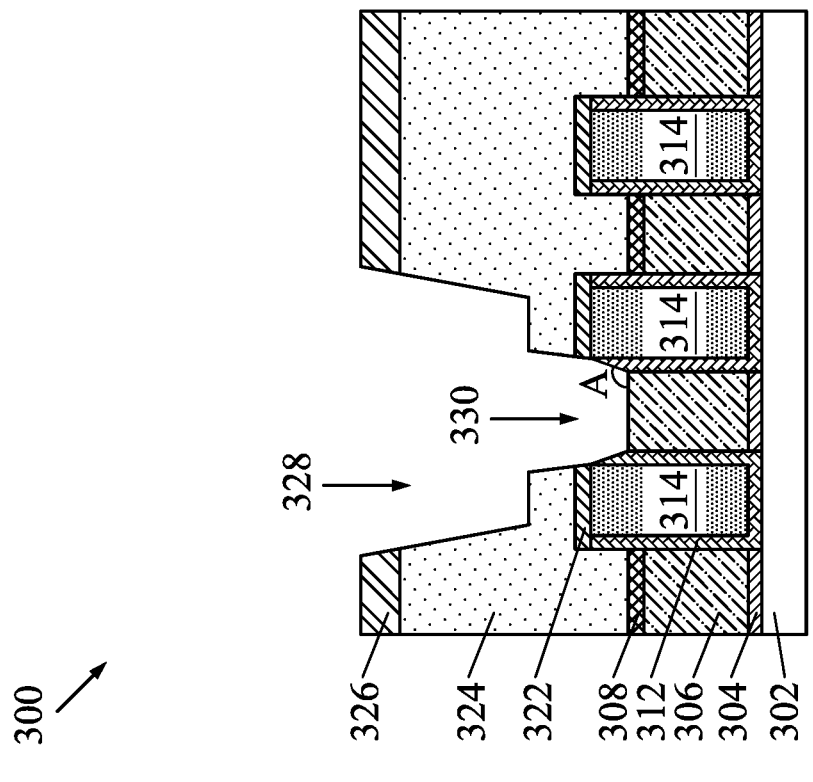
Figure 2I:
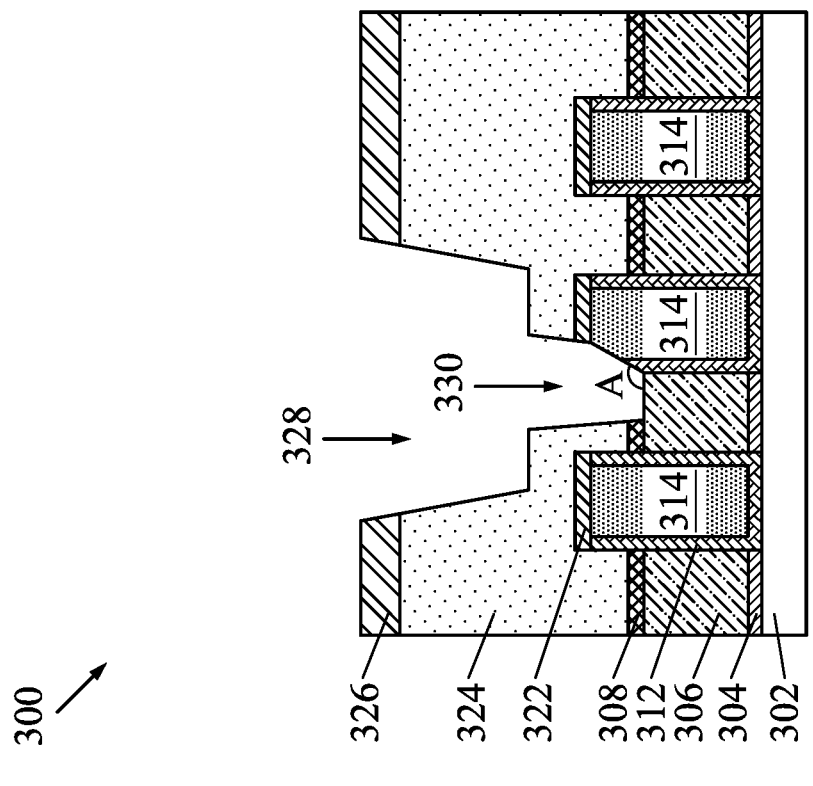
Figure 2L:
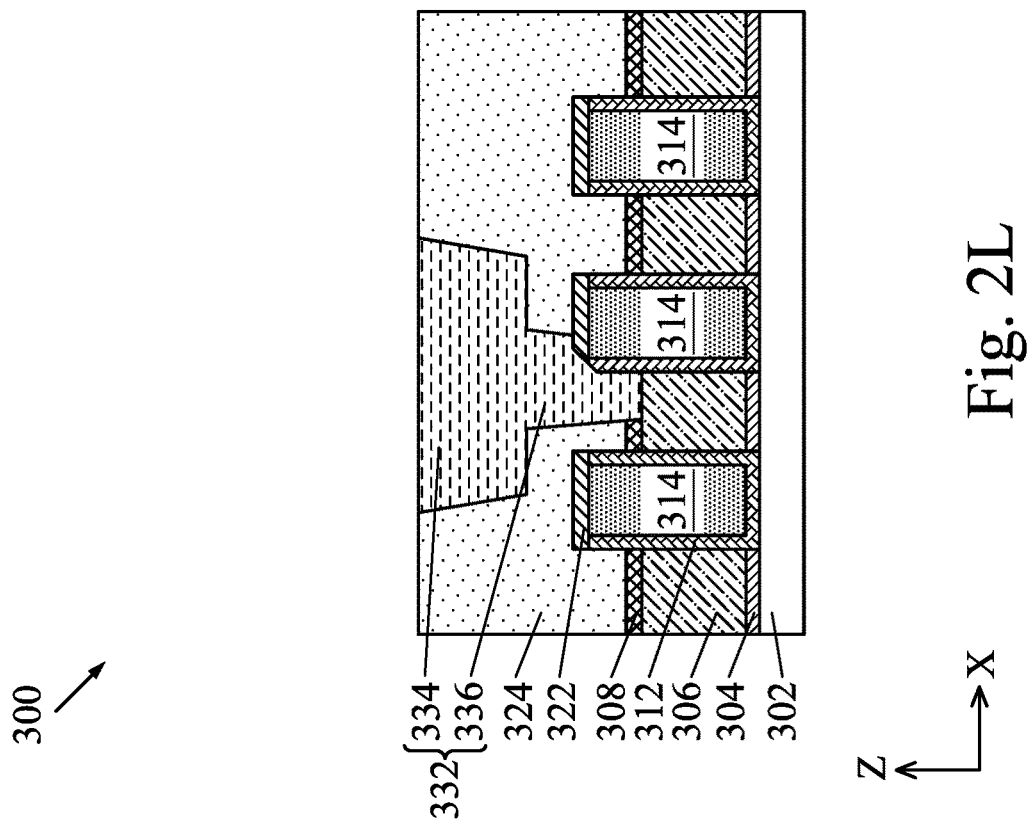
Figure 2K:
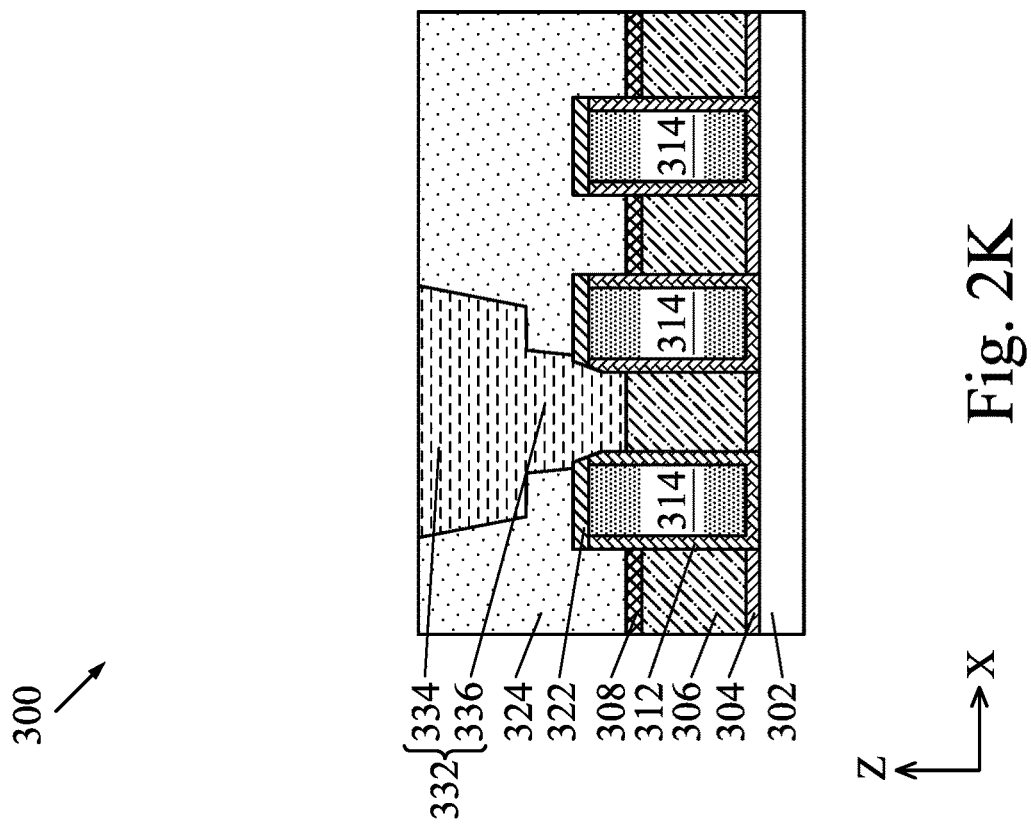
Figure 2N:
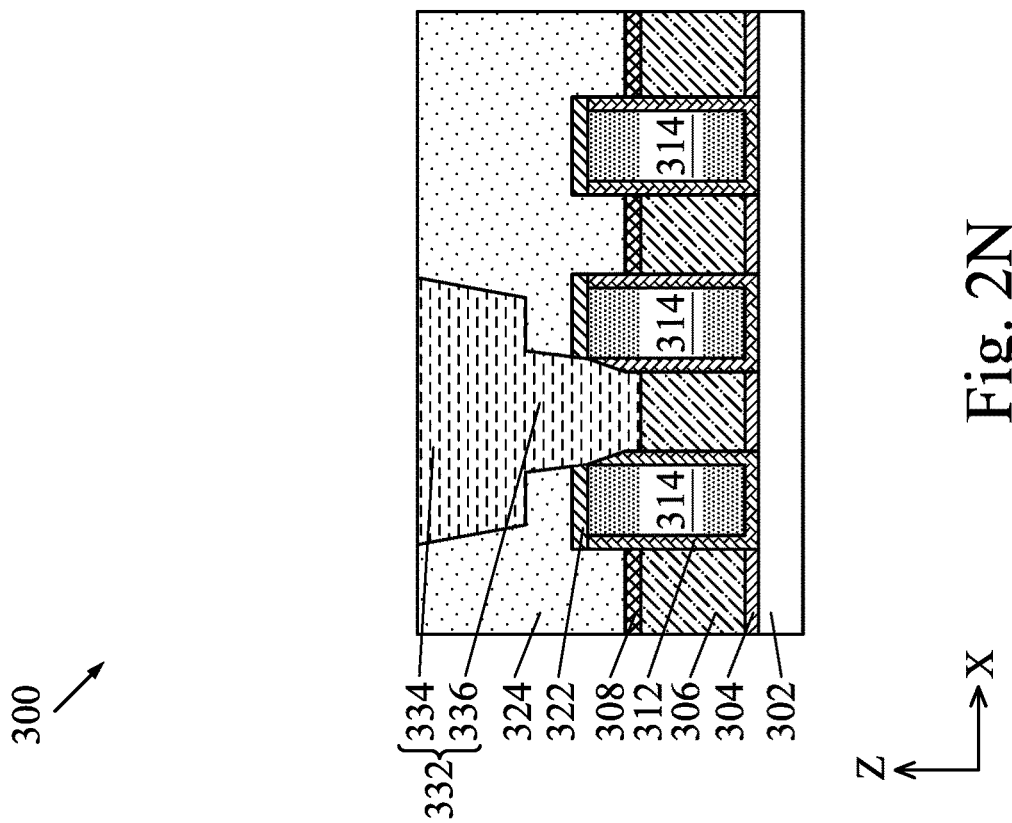

FIGS. 2A-2N are cross-sectional side views of various stages of manufacturing an interconnection structure 300, in accordance with some embodiments. As shown in FIG. 2A, the interconnection structure 300 includes a dielectric layer 302, which may be an ILD layer or an intermetal dielectric (IMD) layer. In some embodiments, the dielectric layer 302 may be disposed over the ILD layer 120 (FIG. 1). In some embodiments, the dielectric layer 302 may be disposed on the cap layer 122 (FIG. 1). The dielectric layer 302 may include one or more conductive features (not shown) disposed therein. The dielectric layer 302 may include an oxygen-containing material, such as silicon oxide or fluorine-doped silicate glass (FSG); a nitrogen-containing material, such as silicon nitride, silicon oxynitride (SiON), SiOCN, SiCN; a low-k dielectric material (e.g., a material having a k value lower than that of the silicon oxide); a carbon-containing material, such as SiC, SiOC, or any suitable dielectric material. The dielectric layer 302 may be formed by chemical vapor deposition (CVD), atomic layer deposition (ALD), spin-on, physical vapor deposition (PVD) or other suitable process.

As shown in FIG. 2A, a glue layer 304, a conductive layer 306, an etch stop layer 308, and a mask layer 310 are formed over the dielectric layer 302. In some embodiment, the glue layer 304 is formed on the dielectric layer 302, the conductive layer 306 is formed on the glue layer 304, the etch stop layer 308 is formed on the conductive layer 306, and the mask layer 310 is formed on the etch stop layer 308. In some embodiments, the glue layer 304 is not present, and the conductive layer 306 is formed on the dielectric layer 302. The glue layer 304 may include Si, SiO, SiN, SiCN, SiON, SiOC, one or more metal nitrides, one or more metals, or other suitable material that can provide adhesion between the conductive layer 306 and the dielectric layer 302 and the conductive features (not shown) formed therein. The glue layer 304 may be formed by any suitable process, such as PVD, CVD, or ALD. The glue layer 304 may have a thickness ranging from about 5 Angstroms to about 200 Angstroms.

The conductive layer 306 may include an electrically conductive material, such as Cu, Co, Ru, Mo, Cr, W, Mn, Rh, Ir, Ni, Pd, Pt, Ag, Au, Al, Ta, TaN, TiN, alloys thereof, or other suitable material. In some embodiments, the conductive layer 306 includes a metal. The conductive layer 306 may be formed by any suitable process, such as PVD, CVD, electroplating, or ALD. The etch stop layer 308 may include Si, SiO, SiN, SiC, SiON, SiOC, one or more metal nitrides, one or more metal oxides, or other suitable material. The etch stop layer 308 includes a material different from the material of the conductive layer 306. The etch stop layer 308 may be formed by any suitable process, such as PVD, CVD, or ALD.

The mask layer 310 may include one or more metals, such as Cu, Co, Ru, Mo, Cr, W, Mn, Rh, Jr, Ni, Pd, Pt, Ag, Au, Al, Ta, Ti, or other suitable metal. In some embodiments, the mask layer 310 includes a metal nitride. The mask layer 310 may be performed by any suitable process, such as PVD, CVD, electroplating, or ALD. The mask layer 310 may be a single layer or a multi-layer structure. The mask layer 310 may include a material different from the material of the conductive layer 306. Thus, the conductive layer 306, the etch stop layer 308, and the mask layer 310 have different etch selectivity such that an etchant can substantially remove one layer but does not substantially affect the other two layers. The mask layer 310 may have a thickness ranging from about 30 Angstroms to about 1000 Angstroms.

As shown in FIG. 2B, one or more openings are formed in the mask layer 310, the etch stop layer 308, the conductive layer 306, and the glue layer 304, and a dielectric material 314 is formed in the openings and over the mask layer 310. In some embodiments, a liner 312 is first formed in the openings and over the mask layer 310, and the dielectric material 314 is formed on the liner 312. The openings may be formed by first patterning the mask layer 310 followed by transferring the pattern of the mask layer 310 to the etch stop layer 308, the conductive layer 306, and the glue layer 304. The patterning of the mask layer 310 and the transferring of the pattern of the mask layer 310 may include one or more etch process, such as dry etch, wet etch, or a combination thereof. In some embodiments, because the conductive layer 306, the etch stop layer 308, and the mask layer 310 have different etch selectivity, three etch processes are performed to form the openings. The openings separate the conductive layer 306 into one or more portions, such as a plurality of portions. In some embodiments, each portion of the conductive layer 306 is a conductive feature, such as a conductive line.

In some embodiment, the etch process used to form the openings in the conductive layer 306 is a plasma etch process. The plasma etch process may utilize inductively coupled plasma (ICP), capacitively coupled plasma (CCP), or remote plasma. The etchant used in the plasma etch process may include $CH_4$, $CHF_3$, $CH_2F_2$, $CHF_3$, $C_4F_8$, $C_4F_6$, $CF_4$, $H_2$, HBr, CO, $CO_2$, $O_2$, $BCl_3$, $Cl_2$, $N_2$, He, Ne, Ar, or combinations thereof. The plasma etch process may be performed at a chamber pressure ranging from about 0.2 mT to about 120 mT and a processing temperature ranging from about 0 degrees Celsius to about 200 degrees Celsius. The plasma power may range from about 50 W to about 3000 W, and a bias ranging from about 0 V to about 1200 V may be applied. In some embodiments, the etch process used to form the openings in the conductive layer 306 is a wet etch process.

The liner 312 may include Si, SiO, SiN, SiC, SiON, SiOC, SiCN, SiOCN, or other suitable material. The liner 312 may be formed by any suitable process, such as ALD. The liner 312 may prevent diffusion of metal from the conductive layer 306 to the dielectric material 314, if the conductive layer 306 includes a metal that is susceptible to diffusion. In some embodiments, the liner 312 is omitted, if the conductive layer 306 includes a metal that is not susceptible to diffusion. In some embodiments, the liner 312 also prevents oxidation of the conductive layer 306 from the subsequent process to form the dielectric material 314, which may be formed by using oxygen-containing precursor or in an oxygen-containing environment. The liner 312 may also protect lateral dimensions of the dielectric material 314 during subsequent processes. The liner 312 has a thickness ranging from about 5 Angstroms to about 200 Angstroms. If the thickness of the liner 312 is less than about 5 Angstroms, the liner 312 may not form a continuous layer, may not be sufficient to prevent metal oxidation of the conductive layer 306, and/or may not be sufficient to prevent the diffusion of metal from the conductive layer 306 to the dielectric material 314. On the other hand, if the liner 312 is greater than about 200 Angstroms, manufacturing cost may be increased without significant advantage.

The dielectric material 314 may include SiC, $SiO_2$, SiOC, SiN, SiCN, SiON, SiOCN, a low-k dielectric material, such as SiCOH, or other suitable material. The dielectric material 314 may be formed by any suitable process, such as spin-on, CVD, ALD, or PVD. The dielectric material 314 includes a material different from the material of the liner 312, and the dielectric material 314 and the liner 312 have different etch selectivity such that an etchant can substantially remove one but does not substantially affect the other.

As shown in FIG. 2C, a planarization process may be performed to remove a portion of the dielectric material 314 and the liner 312 formed over the mask layer 310. The planarization process may be any suitable process, such as a chemical-mechanical polishing (CMP) process. As a result of the planarization process, top surfaces 316 of the mask layers 310 may be substantially co-planar with top surfaces 318 of the dielectric materials 314. The remaining dielectric material 314 may have a thickness ranging from about 30 Angstroms to about 3000 Angstroms. The dielectric material 314 extends above the level of top surface of the etch stop layer 308 due to the presence of the mask layer 310. The dielectric material 314 may be about 30 Angstroms to about 1000 Angstroms above the level of the top surfaces of the etch stop layers 308, which is defined by the thickness of the mask layer 310.

As shown in FIG. 2D, an etch stop layer 322 is formed on the top surfaces 318 of the dielectric material 314 and on the liner 312. The etch stop layer 322 may be selective formed on the dielectric top surfaces 318 of the dielectric material 314 and on the liner 312 but not on the mask layers 310. The etch stop layer 322 may be formed by any selective process. For example, a treatment process may be performed to activate the metallic top surfaces 316 of the mask layers 310. The treatment process may be a plasma or non-plasma treatment process. After the treatment process, a blocking layer (not shown) is selectively formed on the activated metallic top surfaces 316 of the mask layers 310. The blocking layer may not be substantially formed on the dielectric top surfaces 318 of the dielectric material 314 and the liners 312. The blocking layer blocks the etch stop layer 322 from substantially forming on the metallic top surfaces 316 of the mask layer 310. The etch stop layer 322 may include Si, SiO, SiN, SiC, SiON, SiOC, metal nitride, metal oxide, or other suitable material. The etch stop layer 322 may be formed by any suitable process, such as CVD, ALD, PVD, or spin-on. The etch stop layer 322 may have a thickness ranging from about 5 Angstroms to about 200 Angstroms. The etch stop layer 322 may include the same or different material as the etch stop layer 308. In some embodiments, the etch stop layers 308, 322 are both formed with a dielectric material.

As shown in FIG. 2E, the mask layers 310 are removed. The removal of the mask layers 310 may be performed by any suitable process, such as plasma etch, non-plasma chemical etch, wet etch, or other suitable process. The removal of the mask layers 310 is selective, so the etch stop layer 322, the etch stop layers 308, and the liner 312 are not substantially affected.

As shown in FIG. 2F, a dielectric material 324 is formed on the etch stop layers 308, 322, and a cap layer 326 is formed on the dielectric material 324. The dielectric material 324 may include the same or a different material as the dielectric material 314 and may be formed by the same or a different process as the dielectric material 314. The etch stop layers 308, 322 and the dielectric material 324 may include different materials having different etch selectivity. An optional etch stop layer (not shown) may be embedded in the dielectric material 324. The cap layer 326 may include Si, SiO, SiN, SiC, SiON, SiOC, metal nitride, metal carbides, metal oxide, metal, or other suitable material. The cap layer 326 may be a single layer or a multi-layer structure. The material(s) of the cap layer 326 is different from the material of the dielectric material 324. The cap layer 326 may be formed by any suitable process, such as CVD, PVD, ALD, or spin-on. The cap layer 326 may have a thickness ranging from about 30 Angstroms to about 1000 Angstroms.

As shown in FIG. 2G, openings 328, 330 are formed in the cap layer 326 and the dielectric material 324. The openings 328, 330 may be a result of a dual-damascene process. For example, the opening 328 may be first formed by patterning the cap layer 326 and transferring the pattern to a portion of the dielectric material 324. The optional etch stop layer (not shown) embedded in the dielectric material 324 may be utilized in forming the opening 328. The opening 330 is then formed by covering a portion of a bottom of the opening 328. Thus, the opening 330 has smaller dimensions than the opening 328. In some embodiments, the opening 330 is formed first, and the opening 328 is formed after the formation of the opening 330. In some embodiments, the opening 330 is a via and the opening 328 is a trench. The openings 328, 330 may be formed by any suitable processes, such as one or more etch processes. The etch processes also remove one etch stop layer 308 to expose a portion of the conductive layer 306, as shown in FIG. 2G.

As shown in FIG. 2G, discrete etch stop layers 308 are formed on the portions of the conductive layer 306, and discrete etch stop layers 322 are formed on the dielectric materials 314. The discrete etch stop layers 308 and the discrete etch stop layer 322 are formed at different levels. For example, the etch stop layers 322 are located at a level higher than the etch stop layers 308, and there are no etch stop layers disposed on the vertical surfaces of the liner 312 to connect the etch stop layers 308, 322. If there are etch stop layers formed on the vertical surfaces of the liner 312, the one or more etch processes to form the opening 330 may not be able to completely remove the portions of the etch stop layer formed at the bottom corners between the liner 312 and the top surface of the conductive layer 306, leading to a shrinkage of the opening 330. Thus, without the etch stop layers formed on the vertical surfaces of the liner 312, the risk of the opening 330 (i.e., via contact area) shrinkage is reduced.

In some embodiments, the opening 330 is aligned with a portion of the conductive layer 306, as shown in FIG. 2G. In some embodiments, the opening 330 is slightly misaligned with the portion of the conductive layer 306, and a portion of the etch stop layer 322 is exposed, as shown in FIG. 2H. In some embodiments, the etch stop layer 322 includes a material different from the material of the etch stop layer 308. Thus, the etch process to remove the etch stop layer 308 does not substantially affect the etch stop layer 322 due to different etch selectivity. As a result, the opening 330 is not formed in the dielectric material 314. In some embodiments, a different etch process is performed to remove the exposed portion of the etch stop layer 322, and the dielectric material 314 and the liner 312 are exposed in the opening 330. In some embodiments, the etch stop layer 322 and the etch stop layer 308 are made from the same material, and the opening 330 may be formed in the dielectric material 314. In one aspect, the etch process performed to remove the portions of the etch stop layer 308 and the etch stop layer 322 does not substantially affect the dielectric layer 314 and the liner 312. In another aspect, the etch process performed to remove the portions of the etch stop layer 308 and the etch stop layer 322 also removes a portion of the liner 312 and the dielectric material 314. However, the opening 330 is not formed in the dielectric material 314 between adjacent portions of the conductive layer 306 due to the higher level of the dielectric material 314. The amount of the dielectric material 314 extending above the level of the top surface of the etch stop layer 308 is defined by the thickness of the mask layer 310. Thus, if the thickness of the mask layer 310 is less than about 30 Angstroms, the opening 330 may be formed in the dielectric material 314 between adjacent portions of the conductive layer 306, which leads to leakage concern and not enough RC benefit. On the other hand, if the thickness of the mask layer 310 is greater than about 1000 Angstroms, manufacturing cost may be increased without significant advantage. With the reduced risk of forming the opening 330 in the dielectric material 314 between adjacent portions of the conductive layer 306, reliability issues such as poor breakdown voltage or time dependent dielectric breakdown may occur as a result of the line to line leakage may be reduced.

As shown in FIG. 2I, in some embodiments, a corner rounding process may be performed when there is misalignment between the opening 330 and the corresponding portion of the conductive layer 306, in order to increase the dimension of the subsequently formed conductive feature 332 (FIG. 2O) in the opening 330. With the increased dimension of the conductive feature 332 (FIG. 2O) in the opening 330, resistance may be reduced. In addition, the corner rounding process removes sharp corners in the opening 330 and provides the shaving profile of the opening 330, which lead to improved gap-filling process performed subsequently. In some embodiments, the etch stop layer 308 and the etch stop layer 322 include the same material, and one of the etch processes for forming the opening 330 may remove the etch stop layer 308 and a portion of the etch stop layer 322 when misalignment occurs. For example, while etching the etch stop layer 308, the etch stop layer 322 may be also removed, and the liner 312 and the dielectric material 314 may or may not be substantially affected by the etch process, depending on the etch selectivity between the etch stop layers 308, 322 and the dielectric material 314 and the liner 312. In some embodiments, the corner rounding process is performed by a single etch process. Alternatively, a suitable etch process may be utilized to remove the portion of the liner 312 and the portion of the dielectric material 314. The etch process that removes the portion of the liner 312 and the portion of the dielectric material 314 may be controlled so that a sidewall of the liner 312 forms an angle A with respect to the top surface of the portion of the conductive layer 306. The angle A may range from about 85 degrees to about 140 degrees. With the angle A greater than about 90 degrees, such as from about 95 degrees to about 140 degrees, the dimension of the opening 330 is increased compared to the opening 330 shown in FIG. 2H. In some embodiments, the sidewall of the liner 312 may not be substantially flat, such as having a curved cross-sectional profile. The angle A may be defined by a straight line from one end point of the sidewall of the liner 312 to the other end point of the sidewall of the liner 312 with respect to the top surface of the conductive layer 306.

In some embodiments, the etch stop layer 322 includes a material different from the material of the etch stop layer 308. Thus, the etch process that removes the etch stop layer 308 does not substantially affect the etch stop layer 322. A different etch process may be performed to remove the portion of the etch stop layer 322. The etch process that is used to remove the portion of the etch stop layer 322 or a different etch process may be used to remove the portion of the liner 312 and the portion of the dielectric material 314 and may be controlled so that a sidewall of the liner 312 forms the angle A with respect to the top surface of the portion of the conductive layer 306.

In some embodiments, the corner rounding process may be performed even with the opening 330 and the corresponding portion of the conductive layer 306 being aligned, as shown in FIG. 2J. The corner rounding process may be the same as the corner rounding process described in FIG. 2I. As a result, the sidewalls of the liner 312 form the angle A with respect to the top surface of the portion of the conductive layer 306, and the dimension of the opening 330 is increased compared to the opening 330 shown in FIG. 2G.

As shown in FIGS. 2K-2N, a conductive feature 332 is formed in the openings 328, 330. The conductive feature 332 may include a first portion 334 disposed in the opening 328 and a second portion 336 disposed in the opening 330. The conductive feature 332 may include an electrically conductive material, such as a metal. For example, the conductive feature 332 includes Cu, Ni, Co, Ru, Ir, Al, Pt, Pd, Au, Ag, Os, W, Mo, alloys thereof, or other suitable material. The conductive feature 332 may be formed by any suitable process, such as electro-chemical plating (ECP), PVD, CVD, or PECVD. In some embodiments, the first portion 334 of the conductive feature 332 may be a conductive line, and the second portion 336 of the conductive feature 332 may be a conductive via.

In some embodiments, the conductive feature 332 may include a barrier layer (not shown). The barrier layer may include Co, W, Ru, Al, Mo, Ti, TiN, TiSi, CoSi, NiSi, Cu, TaN, Ni, or TiSiNi and may be formed by any suitable process, such as PVD, ALD, or PECVD. In some embodiments, the barrier layer may be a conformal layer formed by a conformal process, such as ALD.

Figure 2M:
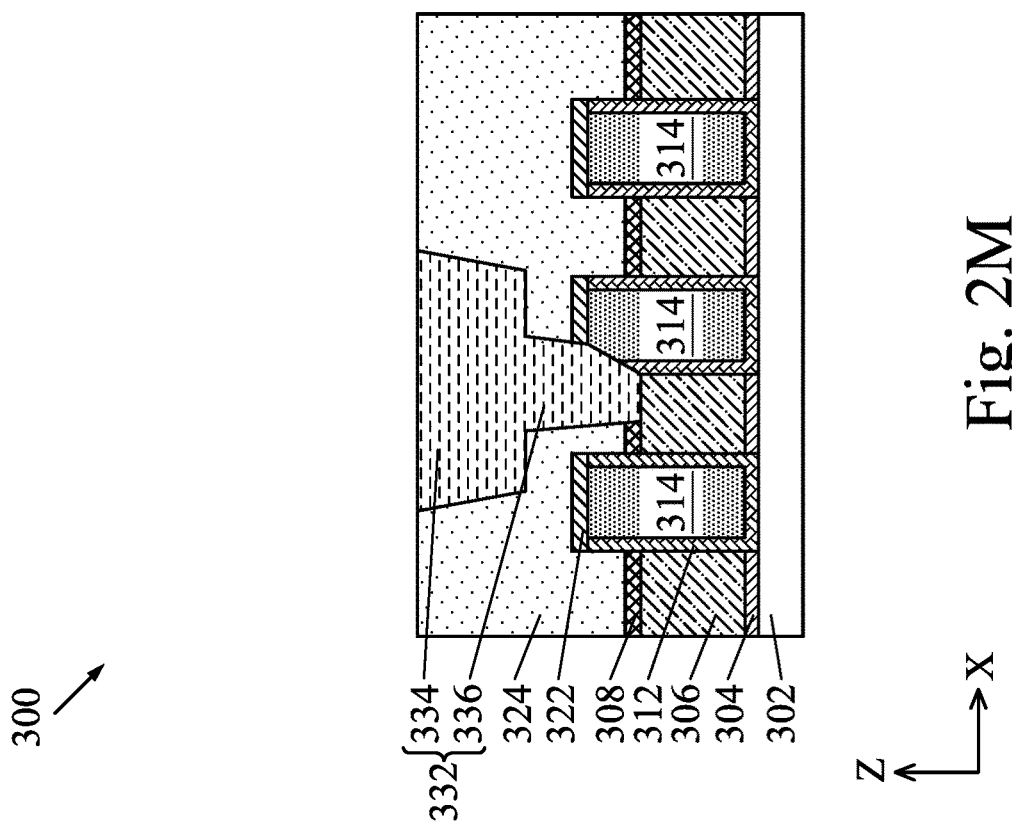

As described above, the discrete etch stop layers 308, 322 disposed at different levels reduces the risk of having portions of etch stop layer remain in the via bottom corners to prevent via contact area shrinkage. As compared with traditional conductive feature, the second portion 336 of the conductive feature 332 may be confined by the extended dielectric material 314, which can prevent the critical dimension (CD) enlargement issue as well as to prevent the electrical leakage issue. In addition, as shown in FIG. 2L, because the etch stop layer 322 has a different etch selectivity compared to the etch stop layer 308, the second portion 336 of the conductive feature 332 is not formed in the dielectric material 314 if a misalignment occurs. Furthermore, the dielectric material 314 extends above the level of the top surface of the etch stop layer 308. Thus, even if the second portion 336 of the conductive feature 332 is formed in the dielectric material 314, the second portion 336 of the conductive feature 332 is not formed between adjacent portions of the conductive layer 306. As described above, with the corner rounding process, the dimensions of the second portion 336 of the conductive feature 332 shown in FIGS. 2M and 2N are greater than the dimensions of the second portion 336 of the conductive feature 332 shown in FIGS. 2L and 2K, respectively.

As shown in FIGS. 2K-2N, the interconnection structure 300 includes a first conductive feature (a portion of the conductive layer 306), a dielectric material 314 disposed adjacent the first conductive feature, and a second conductive feature (a portion of the conductive layer 306) disposed adjacent the dielectric material 314. The etch stop layer 308 is disposed on the first conductive feature, and the etch stop layer 322 is disposed on the dielectric material 314 at a level higher than the etch stop layer 308. The dielectric material 324 is disposed on the etch stop layer 308 and the etch stop layer 322. In some embodiments, the liner 312 is disposed between the first conductive feature and the dielectric material 314 and between the second conductive feature and the dielectric material 314. The liner 312 may be also disposed between the dielectric material 314 and the dielectric layer 302. The liner 312 may be in contact with the etch stop layer 308, the etch stop layer 322, and the dielectric material 324.

In some embodiments, the liner 312 is also in contact with the conductive feature 332. The liner 312 may include a different material than the materials of the etch stop layers 308, 322.

Figure 3B:
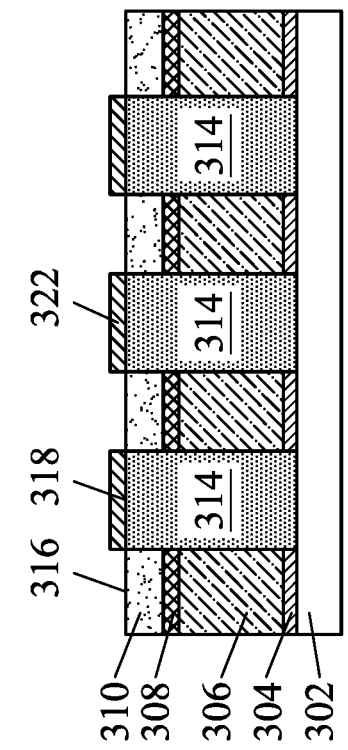
Figure 3A:
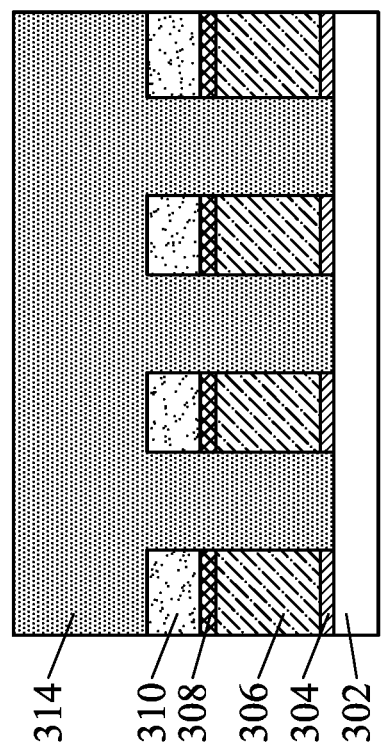

In some embodiments, the liner 312 is omitted. FIGS. 3A-3L are cross-sectional side views of various stages of manufacturing the interconnection structure 300 without the liner 312, in accordance with alternative embodiments. As shown in FIG. 3A, after forming the openings in the mask layer 310, the etch stop layer 308, the conductive layer 306, and the glue layer 304, the dielectric material 314 is formed in the openings. As shown in FIG. 3B, a planarization process is performed, and the etch stop layers 322 are selectively formed on the dielectric material 314.

Figure 3D:
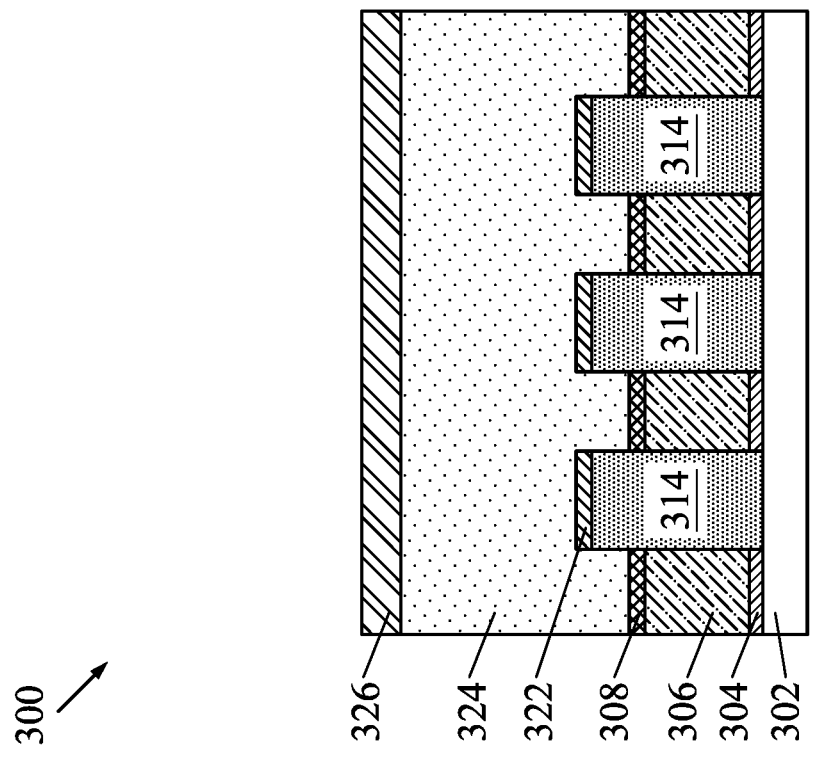
Figure 3C:
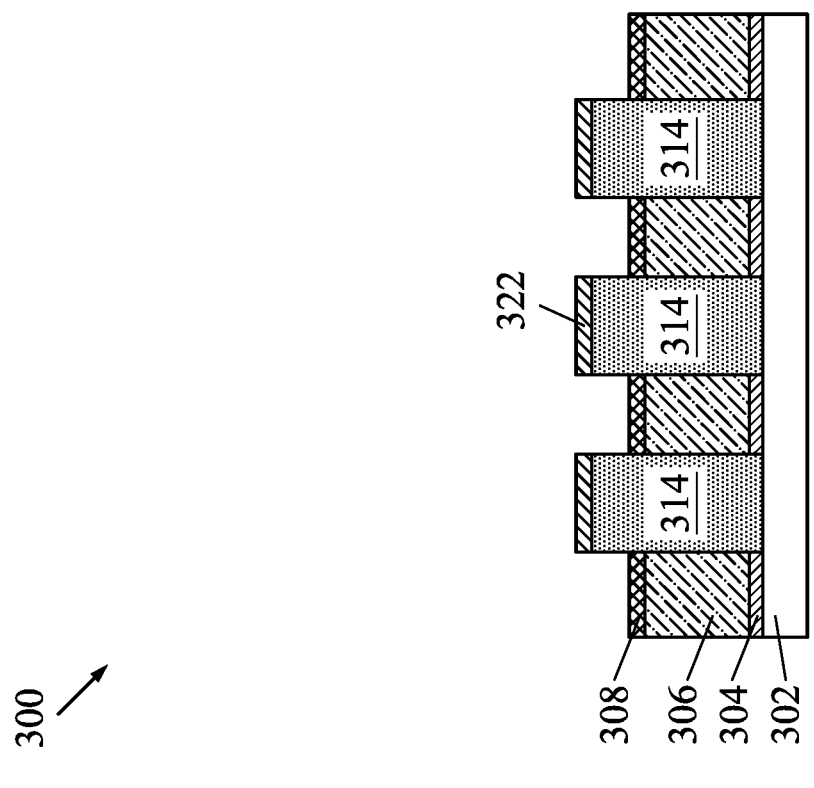
Figure 3H:
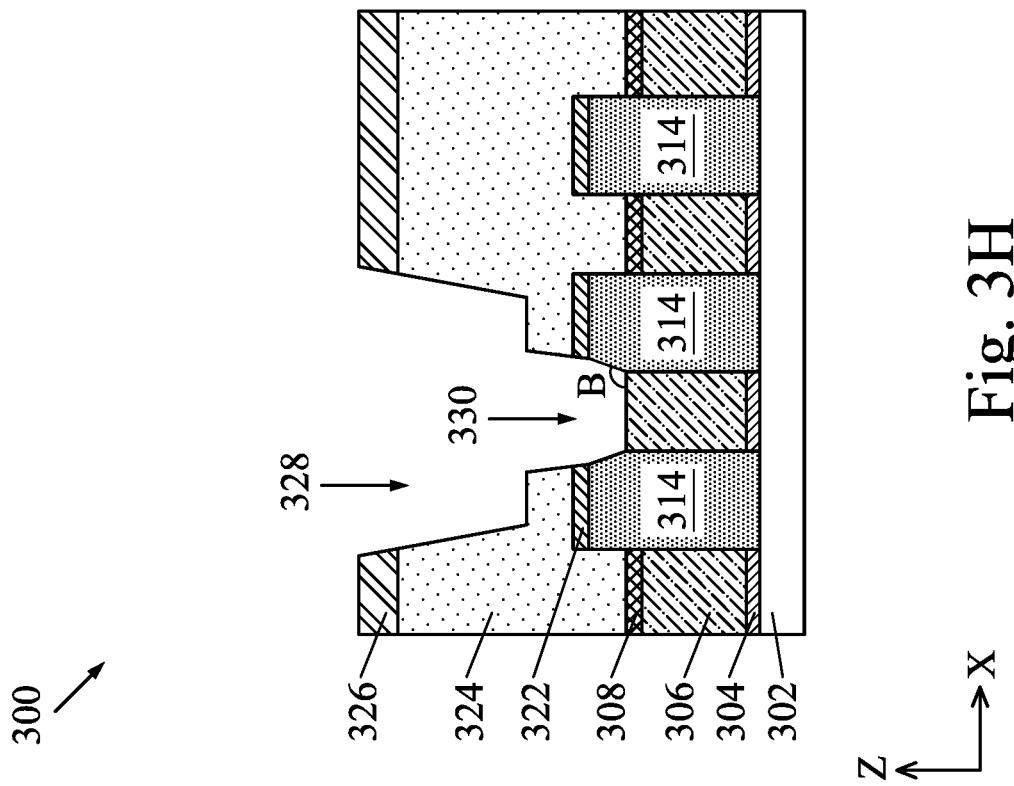
Figure 3G:
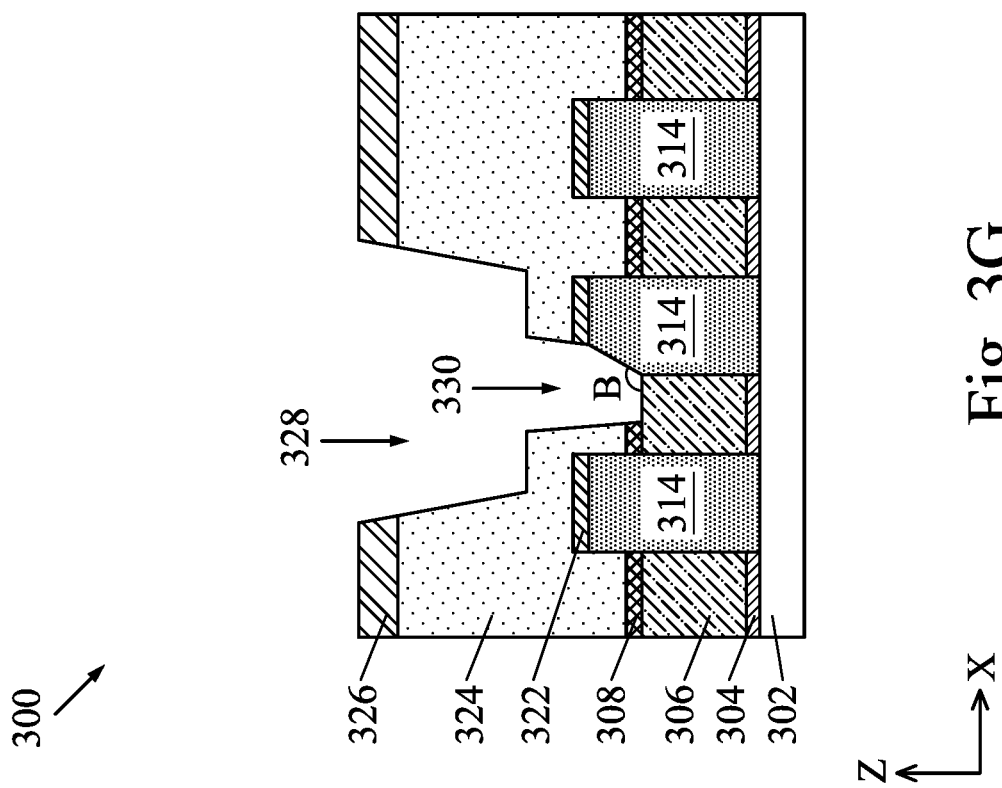
Figure 3J:
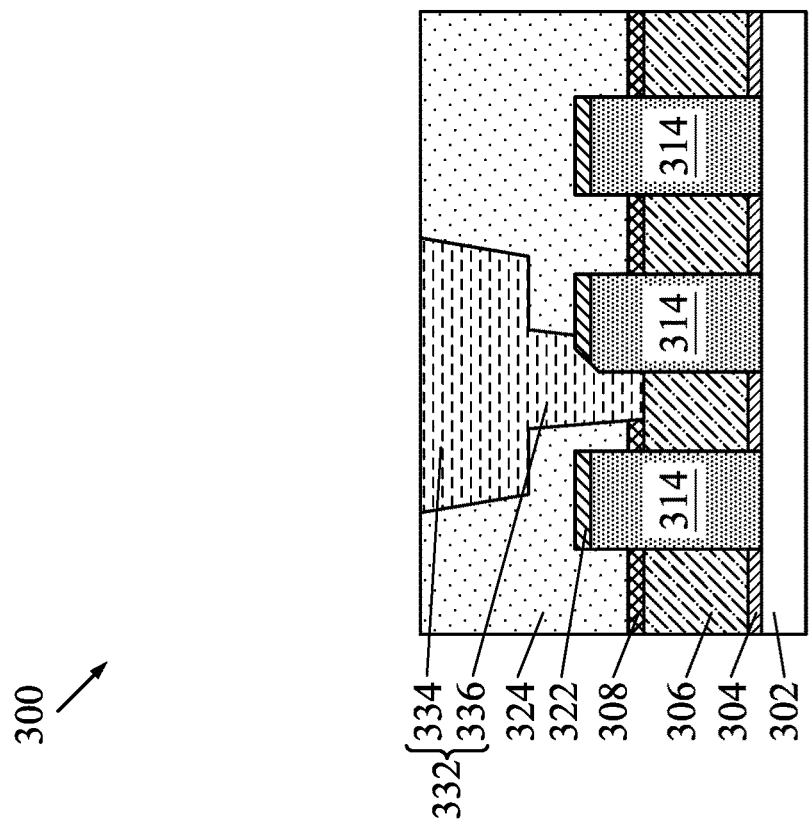
Figure 3I:
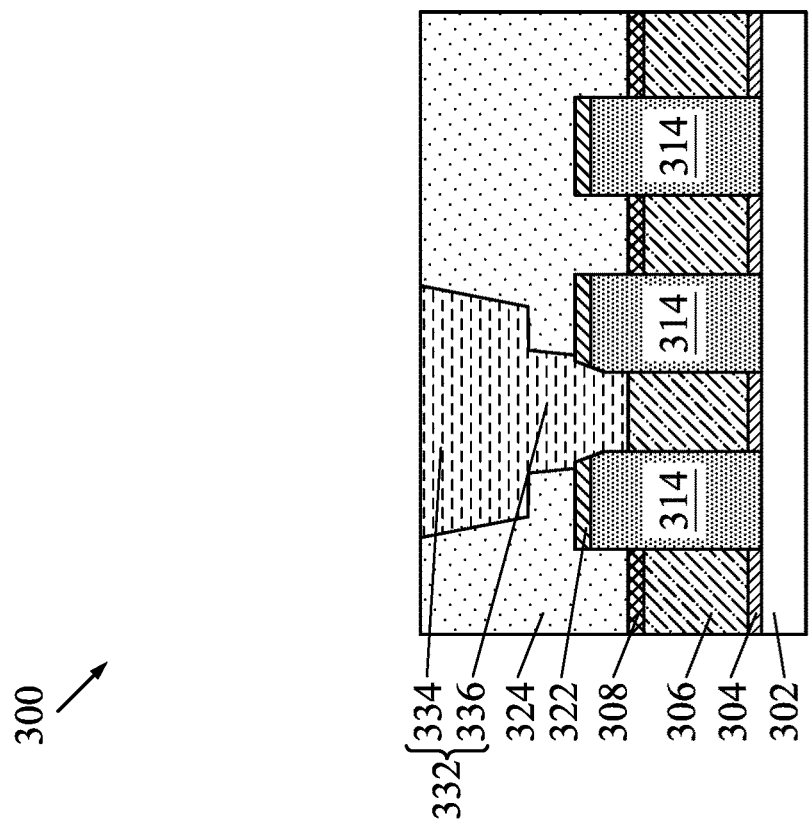
Figure 3L:
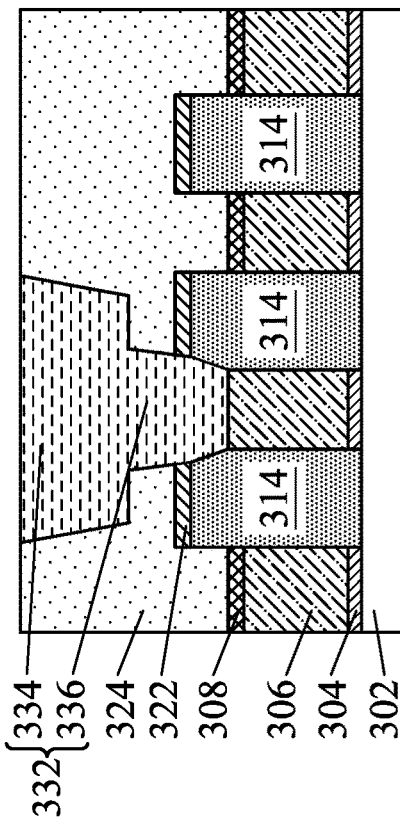
Figure 3K:
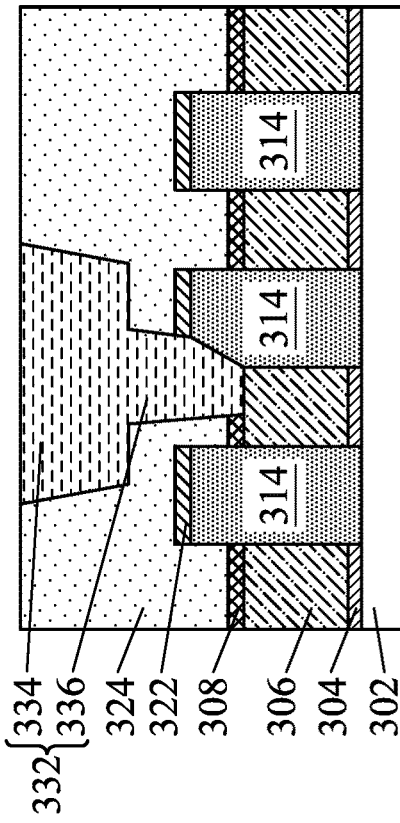

As shown in FIG. 3C, the mask layers 310 are removed. As a result, the discrete etch stop layers 308 and the discrete etch stop layers 322 are formed at different levels due to the different thicknesses between the conductive layer 306 and the dielectric material 314. As shown in FIG. 3D, the dielectric material 324 is formed on the etch stop layers 308, 322, and the cap layer 326 is formed on the dielectric material 324. As shown in FIGS. 3E-3H, the openings 328, 330 are formed in the cap layer 326 and the dielectric material 324. In some embodiments, as shown in FIGS. 3G and 3H, the corner rounding process is performed, and the sidewall of the dielectric material 314 form the angle B with respect to the top surface of the portion of the conductive layer 306. The angle B may range from about 85 degrees to about 140 degrees. With the angle B greater than about 90 degrees, such as from about 95 degrees to about 140 degrees, the dimension of the opening 330 shown in FIGS. 3H and 3G is increased compared to the opening 330 shown in FIGS. 3E and 3F, respectively.

As shown in FIGS. 3I-3L, the conductive feature 332 is formed in the openings 328, 330. For example, in some embodiments, the interconnection structure 300 includes a first conductive feature (a portion of the conductive layer 306), a dielectric material 314 disposed adjacent the first conductive feature, and a second conductive feature (a portion of the conductive layer 306) disposed adjacent the dielectric material 314. The etch stop layer 308 is disposed on the first conductive feature, and the etch stop layer 322 is disposed on the dielectric material 314 at a level higher than the etch stop layer 308. The dielectric material 324 is disposed on the etch stop layer 308 and the etch stop layer 322. In some embodiments, dielectric material 314 may be in contact with the etch stop layer 308, the etch stop layer 322, and the dielectric material 324, as shown in FIGS. 3I-3L. For example, the dielectric material 314 may include a first sidewall and a second sidewall opposite the first sidewall. The first sidewall of the dielectric material 314 may be in contact with the glue layer 304, a portion of the conductive layer 306, the etch stop layer 308, and the dielectric material 324. The second sidewall of the dielectric material 314 may be in contact with the glue layer 304, another portion of the conductive layer 306, and the second portion 336 of the conductive feature 332.

The present disclosure in various embodiments provides discrete etch stop layers 308 disposed on the portions of the conductive layer 306 and discrete etch stop layers 322 disposed on the dielectric material 314 at a higher level. Some embodiments may achieve advantages. For example, without the etch stop layers formed on the vertical surfaces of the liner 312 or the dielectric material 314, the risk of the opening 330 (i.e., via contact area) shrinkage is reduced. Furthermore, the dielectric material 314 extending to a level higher than the etch stop layer 308 prevents a conductive feature 332 from forming between the adjacent portions of the conductive layer 306, leading to reduced line to line leakage when misalignment occurs.

An embodiment is an interconnection structure. The structure includes a first conductive feature having a first thickness, a first dielectric material disposed adjacent the first conductive feature, and the first dielectric material has a second thickness greater than the first thickness. The structure further includes a second conductive feature disposed adjacent the first dielectric material, a first etch stop layer disposed on the first conductive feature, a second etch stop layer disposed on the first dielectric material, and a second dielectric material disposed on the first etch stop layer and the second etch stop layer. The second dielectric material is in contact with the first dielectric material.

Another embodiment is a structure. The structure includes a first conductive feature, a first dielectric material disposed adjacent the first conductive feature, a second conductive feature disposed adjacent the first dielectric material, a first etch stop layer disposed on the first conductive feature, and a second etch stop layer disposed on the first dielectric material. The second etch stop layer is at a different level as the first etch stop layer. The structure further includes a first liner disposed between the first conductive feature and the first dielectric material, and the first liner is in contact with the first and second etch stop layers. The structure further includes a second dielectric material disposed on the first etch stop layer and the second etch stop layer, and the second dielectric material is in contact with the first liner.

A further embodiment is a method. The method includes forming a first etch stop layer on a conductive layer, forming a mask layer on the first etch stop layer, and the mask layer comprises a metal. The method further includes forming one or more openings in the mask layer, the first etch stop layer, and the conductive layer, forming a first dielectric material in the one or more openings, and top surfaces of the first dielectric material and the mask layer are substantially co-planar. The method further includes selectively forming a second etch stop layer on the first dielectric material, removing the mask layer, and forming a second dielectric material on the first and second etch stop layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
   forming a first etch stop layer on a conductive layer;
   forming a mask layer on the first etch stop layer, wherein the mask layer comprises a metal;
   forming one or more openings in the mask layer, the first etch stop layer, and the conductive layer;
   forming a first dielectric material in the one or more openings, wherein top surfaces of the first dielectric material and the mask layer are substantially co-planar;
   selectively forming a second etch stop layer on the first dielectric material;
   removing the mask layer; and
   forming a second dielectric material on the first and second etch stop layers.

2. The method of claim 1, further comprising forming a liner in the one or more openings, wherein the first dielectric material is formed on the liner.

3. The method of claim 1, further comprising:
   forming first and second openings in the second dielectric material; and
   forming a conductive feature in the first and second openings, wherein the conductive feature has a first portion formed in the first opening and a second portion formed in the second opening.

4. The method of claim 3, wherein the forming the second opening comprises removing a portion of the first etch stop layer to expose a portion of the conductive layer.

5. The method of claim 4, wherein the forming the second opening further comprises removing a portion of the second etch stop layer.

6. A method, comprising:
   forming a first etch stop layer on a conductive layer;
   forming a mask layer on the first etch stop layer;
   forming one or more openings in the mask layer, the first etch stop layer, and the conductive layer to form one or more portions of the mask layer, one or more portions of the first etch stop layer, and one or more portions of the conductive layer;
   forming a liner in the one or more openings, wherein the liner is formed on the one or more portions of the mask layer and on sidewalls of the one or more portions of the conductive layer;
   forming a first dielectric material on the liner in the one or more openings;
   performing a planarization process to expose top surfaces of the one or more portions of the mask layer, top surfaces of the first dielectric material, and top surfaces of the liner;
   selectively forming discrete second etch stop layers on the top surfaces of the liner and the top surfaces of the first dielectric material;
   removing the one or more portions of the mask layer; and
   forming a second dielectric material on the one or more portions of the first etch stop layer and on the discrete second etch stop layers.

7. The method of claim 6, further comprising forming a glue layer, wherein the conductive layer is formed on the glue layer.

8. The method of claim 7, wherein the one or more openings are formed in the glue layer to form one or more portions of the glue layer.

9. The method of claim 6, wherein the first dielectric material extends to a level above a level of top surfaces of the one or more portions of the first etch stop layer after performing the planarization process.

10. The method of claim 6, wherein the mask layer comprises Cu, Co, Ru, Mo, Cr, W, Mn, Rh, Ir, Ni, Pd, Pt, Ag, Au, Al, Ta, or Ti.

11. The method of claim 10, wherein the conductive layer comprises Cu, Co, Ru, Mo, Cr, W, Mn, Rh, Ir, Ni, Pd, Pt, Ag, Au, Al, Ta, TaN, or TiN.

12. The method of claim 11, wherein the first etch stop layer comprises Si, SiO, SiN, SiC, SiON, or SiOC.

13. The method of claim 12, wherein the discrete second etch stop layers comprise a material different from the first etch stop layer.

14. A method, comprising:
   simultaneously forming discrete first etch stop layers by forming one or more openings, wherein the discrete first etch stop layers are disposed on portions of a conductive layer, and the portions of the conductive layer are separated by the one or more openings;

forming a first dielectric material in the one or more openings;

performing a planarization process to expose top surfaces of the first dielectric material, wherein the top surfaces of the first dielectric material are at a level above a level of top surfaces of the discrete first etch stop layers;

simultaneously forming discrete second etch stop layers on the top surfaces of the first dielectric material; and forming a second dielectric material on the discrete first etch stop layers and on the discrete second etch stop layers.

15. The method of claim 14, further comprising:

forming first and second openings in the second dielectric material; and forming a conductive feature in the first and second openings, wherein the conductive feature has a first portion formed in the first opening and a second portion formed in the second opening.

16. The method of claim 15, wherein the forming the second opening comprises removing a portion of the first etch stop layer.

17. The method of claim 16, wherein the forming the second opening further comprises removing a portion of the second etch stop layer.

18. The method of claim 14, further comprising forming a glue layer, wherein the conductive layer is formed on the glue layer.

19. The method of claim 18, wherein the one or more openings are formed in the glue layer.

20. The method of claim 14, further comprising forming a liner in the one or more openings, wherein the first dielectric material is formed on the liner.

* * * * *